(12) United States Patent
Suzuki

(10) Patent No.: US 6,884,318 B2
(45) Date of Patent: Apr. 26, 2005

(54) PLASMA PROCESSING SYSTEM AND SURFACE PROCESSING METHOD

(75) Inventor: Nobumasa Suzuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 198 days.

(21) Appl. No.: 10/259,729

(22) Filed: Sep. 30, 2002

(65) Prior Publication Data

US 2003/0066487 A1 Apr. 10, 2003

(30) Foreign Application Priority Data

Sep. 28, 2001 (JP) ........................................ 2001-301556

(51) Int. Cl.⁷ .......................... H05H 1/00; C23C 16/00; H01L 21/00
(52) U.S. Cl. .......................... 156/345.41; 118/723 MW; 438/726
(58) Field of Search ....................... 156/345.41, 345.42; 118/723 MW, 723 MA; 438/726, 728

(56) References Cited

U.S. PATENT DOCUMENTS

| 5,803,975 A | 9/1998 | Suzuki | 118/723 |
| 6,238,527 B1 | 5/2001 | Sone et al. | 204/192.12 |
| 6,290,807 B1 * | 9/2001 | Matsumoto et al. | 156/345.41 |
| 6,652,709 B1 * | 11/2003 | Suzuki et al. | 156/345.41 |
| 2001/0054605 A1 * | 12/2001 | Suzuki et al. | 219/121.43 |

FOREIGN PATENT DOCUMENTS

| EP | 564359 B1 * | 9/1996 | F27B/17/00 |
| EP | 997927 A2 * | 5/2000 | H01J/37/32 |
| JP | 10-233295 | 9/1998 | |
| JP | 2001250778 A * | 9/2001 | H01L/21/205 |

* cited by examiner

Primary Examiner—Parviz Hassanzadeh
(74) Attorney, Agent, or Firm—Fitzpatrick, Cella, Harper & Scinto

(57) ABSTRACT

A plasma processing system in which air in a plasma processing chamber is exhausted by an exhaust unit and a microwave is supplied to the plasma processing chamber through an annular waveguide which is provided at predetermined intervals in a circumferential direction on the same plane facing a surface of an object to be processed on the plasma processing chamber side to generate plasma within the plasma processing chamber. The annular waveguide is separated into two layers of an input side waveguide and an output side waveguide. The slots are provided between these waveguides at predetermined intervals in a circumferential direction.

11 Claims, 5 Drawing Sheets

PLASMA PROCESSING SYSTEM AND SURFACE PROCESSING METHOD

BACKGROUND OF THE INVENTION

1. Field of the Invention

The present invention relates to a plasma processing system for introducing a microwave into a plasma processing chamber through an annular waveguide having a plurality of slots provided on the side of the plasma processing chamber to generate plasma in the plasma processing chamber, and also relates to a surface processing method and a method of manufacturing an element, using the same.

2. Related Background Art

As to plasma processing systems using a microwave as an excitation source for generating plasma, there are known an etching system, an ashing system, a CVD system, a doping system and the like.

Semiconductor devices such as transistors, diodes and LSIs are manufactured by subjecting a semiconductor substrate (wafer) having a large number of semiconductor elements formed thereon to the various kinds of surface processings using a large number of systems such as the above-mentioned plasma processing system and the like.

The etching processing for an object to be processed using a microwave plasma etching system, for example, is carried out in the following manner. That is to say, etchant gas is introduced into a plasma processing chamber of the microwave plasma etching system and at the same time, the microwave energy is supplied thereto to excite and decompose the etchant gas to thereby etch away the surface of the object to be processed which is arranged within the plasma processing chamber.

In addition, the ashing processing for an object to be processed using a microwave plasma ashing system, for example, is carried out in the following manner. That is to say, ashing gas is introduced into a plasma processing chamber of the microwave plasma ashing system and at the same time, the microwave energy is supplied thereto to excite and decompose the ashing gas to thereby ash the surface of the object to be processed which is arranged within the plasma processing chamber.

Also, the film forming processing for an object to be processed using a microwave plasma CVD system, for example, is carried out in the following manner. That is to say, reactive gas is introduced into a plasma processing chamber of the microwave plasma CVD system and at the same time, the microwave energy is supplied thereto to excite and decompose the reactive gas to thereby deposit a film on the subject to be processed which is arranged within the plasma processing chamber.

Moreover, the doping processing for an object to be processed using a microwave plasma doping system, for example, is carried out in the following manner. That is to say, doping gas is introduced into a plasma processing chamber of the microwave plasma doping system and at the same time, the microwave energy is supplied thereto to excite and decompose the reactive gas to thereby dope the surface of the object to be processed which is arranged within the plasma processing chamber with desired impurities.

Since in the microwave plasma processing system, the microwave having a high frequency is used as the excitation source for the gas, the number of times of acceleration of electrons increases to increase the electron density and hence the gas molecules can be effectively ionized and excited. For this reason, the microwave plasma processing system has the advantage that the ionization efficiency, the excitation efficiency and decomposition efficiency of gas are all high and the high-quality processing can be therefore carried out at high speed even at low temperatures. In addition, since the microwave has the property of permeating dielectric, there is also offered the advantage that the plasma processing system can be constructed as being of an electrodeless discharge type so that the highly clean plasma processing can be made.

In order to further promote the high speed processing in such microwave plasma processing systems, the plasma processing system utilizing the electron cyclotron resonance (ECR) has also been made fit for practical use. The ECR is the phenomenon in which when the magnetic flux density is 87.5 mT, the electron cyclotron frequency at which the electrons turn round the line of magnetic force matches the frequency of 2.45 GHz which is general in the microwave and the electrons absorb the microwave resonantly to thereby be accelerated to generate the high-density plasma.

As one example of the microwave plasma processing systems, in recent years, there has been proposed a system employing an annular non-terminal waveguide as the apparatus for introducing uniformly and efficiently the microwave in which a plurality of linear slots are radially formed on a plate-like H face (refer to JP-A-10-233295). This microwave plasma processing system is shown in FIG. 5A, and its plasma generating mechanism is shown in FIGS. 5B and 5C. In these figures, reference numeral 901 designates a plasma processing chamber; reference numeral 902, an object to be processed; reference numeral 903, a supporting body for supporting the substrate 902; reference numeral 904, means for adjusting a temperature of the substrate 902; reference numeral 905, means for applying a high-frequency bias; reference numeral 906, means for introducing processing gas; reference numeral 907, exhaust means; reference numeral 908, means for adjusting an exhaust conductance; reference numeral 909, a dielectric member for separating therethrough the plasma processing chamber 901 from the atmospheric side; reference numeral 910, an annular non-terminal waveguide with slots for introducing the microwave into the plasma processing chamber 901 after permeation through the dielectric member 909; reference numeral 912, a microwave waveguide within the annular non-terminal waveguide 910; reference numeral 913, an E distributor for distributing the microwave introduced into the annular non-terminal waveguide 910 right and left; reference numeral 915, a slot; reference numeral 916, a surface wave which is introduced through the slots 915 to be propagated on the surface of the dielectric member 909; reference numeral 917, a surface standing wave which is generated due to the interference between the surface waves 916 introduced through the adjacent slots; 918, surface plasma which is generated due to the presence of the surface standing wave 917; and 919, bulk plasma which is generated due to the diffusion of the surface plasma 918.

The generation of the plasma and the processing thereby are carried out in the following manner. Air in the plasma processing chamber 901 is vacuum-exhausted through the exhaust means 907. Subsequently, plasma processing gas is introduced at predetermined flow rate into the plasma processing chamber 901 through the means 906 for introducing therethrough processing gas. Next, the means 908 for adjusting an exhaust conductance which is provided between the plasma processing chamber 901 and the exhaust means 907 is adjusted to hold the inside of the plasma processing chamber at a predetermined pressure. If necessary, the bias voltage is applied to the object 902 to be processed through the means 905 for applying a high-frequency bias.

The desired electric power is supplied from a microwave power source (not shown) to the plasma processing chamber 901 through the annular non-terminal waveguide 910. In this connection, the microwave which has been introduced into the annular non-terminal waveguide 910 is distributed right and left to be propagated through the waveguide 912 with a wavelength inside the waveguide longer than the wavelength in the free space. The microwaves obtained through the distribution interfere with each other to generate the standing wave 917 at intervals of one half the wavelength inside the waveguide.

The electrons are accelerated by the surface standing wave 917 which is generated in the plasma processing chamber 901 after permeation of the microwave through the dielectric member 909 to generate the surface plasma 918. In addition, the bulk plasma 919 is generated due to the diffusion of the surface plasma 918. The surface-wave interfered plasma (SIP) thus generated has the two-layer structure consisting of the surface plasma 918 and the bulk plasma 919. At this time, if the processing gas is introduced into the plasma processing chamber 901 through the means 906 for introducing therethrough processing gas, then the processing gas is excited by the high-density plasma thus generated to process the surface of the object 902 to be processed which is placed on the supporting body 903.

However, when the microwave is introduced into the plasma processing chamber in the above-mentioned system, there is encountered the problem that the uniformity of the microwave in a circumferential direction of the waveguide is reduced due to the change in conditions such as the pressure and the microwave electric power to reduce the uniformity of the generated plasma accordingly.

SUMMARY OF THE INVENTION

The present invention has been made in view of the above-mentioned problems, and an object thereof is therefore to provide a plasma processing system capable of introducing a uniform microwave into a plasma processing chamber irrespective of conditions, a surface processing method and a manufacturing method of an element, using the same.

In order to solve the above-mentioned problems, according to the present invention, there is provided a plasma processing system in which gas is introduced into a plasma processing chamber, and a microwave is supplied to the plasma processing chamber through an annular waveguide having a plurality of slots provided at predetermined intervals in a circumferential direction on the same plane facing a surface to be processed of an object to be processed on the plasma processing chamber side to generate the plasma within the plasma processing chamber, characterized in that the annular waveguide includes an input side waveguide and an output side waveguide, and the slots are bored to be provided between the waveguides at predetermined intervals in a circumferential direction. Therefore, it becomes possible to carry out the high quality processing uniformly at higher speed.

Further, it is preferable that the microwave is introduced through introduction ports which are provided at predetermined intervals in a circumferential direction with a center of the annular waveguide as an axis into the input side waveguide.

Further, it is preferable that the distributed microwaves are introduced through the introduction ports, and the microwave is distributed by an H distributor when one circumferential length of the input side waveguide is odd number multiples of the wavelength inside the waveguide of the microwave, while the microwave is distributed by an E distributor when one circumferential length of the input side waveguide is even number multiples of the waveguide inside the waveguide of the microwave, and each of the predetermined intervals at which the introduction ports are provided is 180 degrees.

Further, it is preferable that the microwave to be introduced into the input side waveguide is introduced through a rectangular waveguide, and an inner cross section of the input side waveguide is the same dimensions as those of the rectangular waveguide.

Further, it is preferable that the slots provided between the waveguides two by two are provided radially and when the central radii of the waveguides are respectively $r_{g2}$ and $r_{g1}$, the central radius rs2 of each of the slots is expressed by the following approximate expression:

$$r_{s2} \approx (r_{g2} + r_{g1})/2$$

It is preferable that a dielectric window is provided between the annular waveguide and the plasma processing chamber, and the main constituent of the dielectric window is aluminum nitride.

It is preferable that substrate supporting means for supporting the object to be processed within the plasma processing chamber further comprises high-frequency bias applying means for applying a high frequency bias.

A surface processing method according to the present invention is characterized in that the processing of the surface to be processed of the object to be processed uses the above-mentioned plasma processing system.

Further, it is preferable that the surface processing according to the present invention is any one of etching, ashing, CVD, doping, oxidation and nitriding processing.

Further, it is preferable that a manufacturing method of an element according to the present invention is characterized by comprising surface processing of the surface to be processed of the object to be processed for forming the element, which uses the above-mentioned plasma processing.

Further, it is preferable that the surface processing according to the present invention is any one of etching, ashing, CVD, doping, oxidation and nitriding processing.

BRIEF DESCRIPTION OF THE DRAWINGS

The above and other objects as well as advantages of the present invention will become clear by the following description of the preferred embodiments of the present invention with reference to the accompanying drawings, wherein.

DESCRIPTION OF THE PREFERRED EMBODIMENTS

Figure 1A:
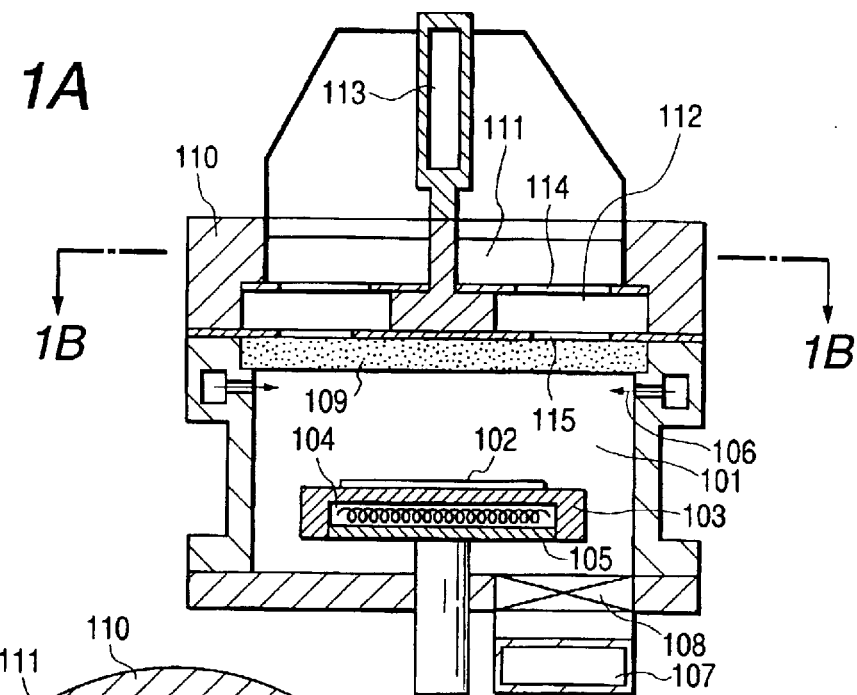
FIGS. 1A, 1B and 1C are respectively a cross sectional view and a schematic view showing an example of a plasma processing system according to the present invention.
Figure 1B:
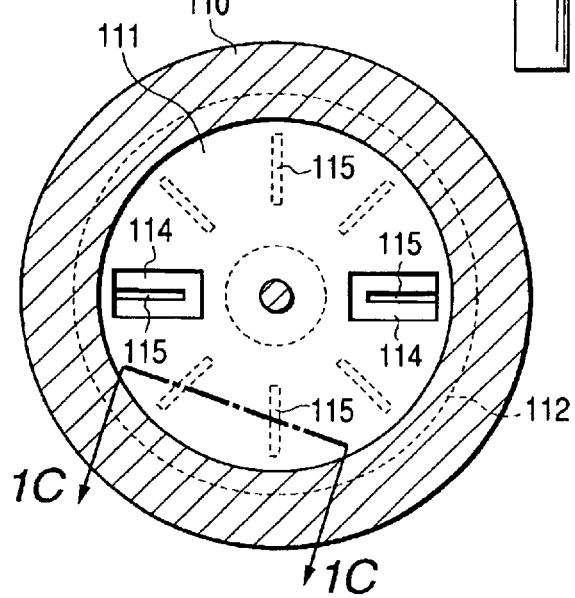
Figure 1C:
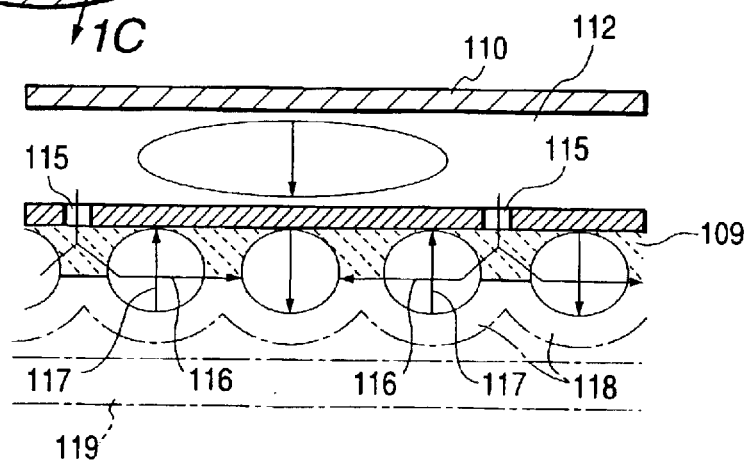

First of all, the basic idea of the present invention will hereinafter be described with reference to FIGS. 1A to 1C. FIGS. 1A to 1C are respectively a cross sectional view and a schematic view showing an embodiment of a plasma processing system according to the present invention. FIG. 1B shows a cross sectional view along a line 1B—1B in FIG. 1A, FIG. 1C shows a cross sectional view along a line 1C—1C in FIG. 1B. In these figures, reference numeral 101 designates a plasma processing chamber; reference numeral 102 designates an object to be processed; reference numeral 103 designates a supporting body for supporting the substrate 102; reference numeral 104 designates means for adjusting a temperature of the substrate 102; reference numeral 105 designates means for applying a high-frequency bias; reference numeral 106 designates means for introducing therethrough processing gas; reference numeral 107 designates exhaust means; reference numeral 108 designates means for adjusting an exhaust conductance; reference numeral 109 designates a dielectric member for separating therethrough the plasma processing chamber 101 from the atmosphere side; reference numeral 110 designates an annular non-terminal waveguide with slots having two-layer structure for introducing the microwave into the plasma processing chamber 101 through the dielectric member 109; reference numeral 111, an input side annular waveguide within the annular non-terminal waveguide 110 having two-layer structure; reference numeral 112, an output side annular waveguide within the annular non-terminal waveguide 110 having the two-layer structure; reference numeral 113, a two-distribution waveguide such as an E distributor or an H distributor for introducing the microwave through two ways, i.e., through two introduction ports of the input side annular waveguide 111; reference numeral 114, a waveguide coupling slot which is bored to be provided between the input side annular waveguide 111 and the output side annular waveguide 112 to couple therethrough the waveguides to each other; reference numeral 115, an output side slot which is provided on the side of the plasma processing chamber of the annular non-terminal waveguide; reference numeral 116, a surface wave which is introduced through the output side slots to be propagated on the surface of the dielectric member 109; reference numeral 117, a surface standing wave which is generated due to the interference between the surface waves 116 introduced through the adjacent slots; 118, surface plasma which is generated due to the presence of the surface standing wave 117; and 119, bulk plasma which is generated due to the diffusion of the surface plasma.

Figure 5A:
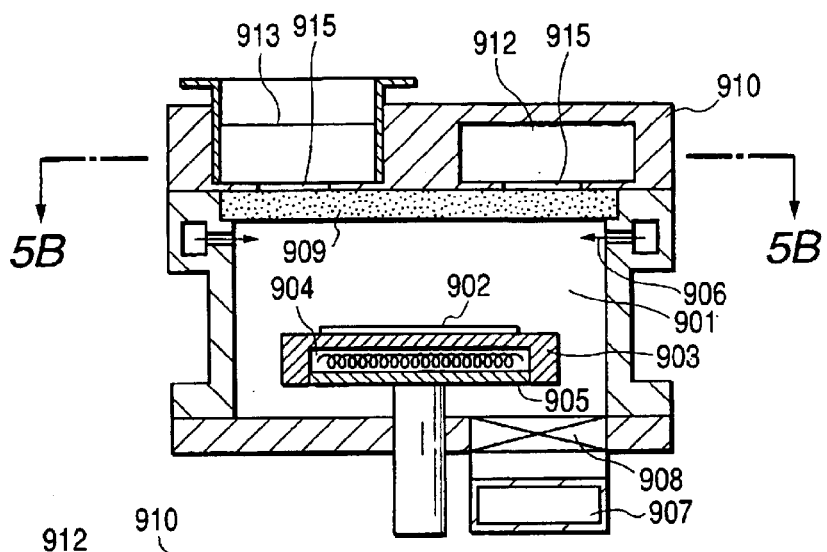
FIGS. 5A, 5B and 5C are respectively a cross sectional view and a schematic view showing a plasma processing system according to the prior art.
Figure 5B:
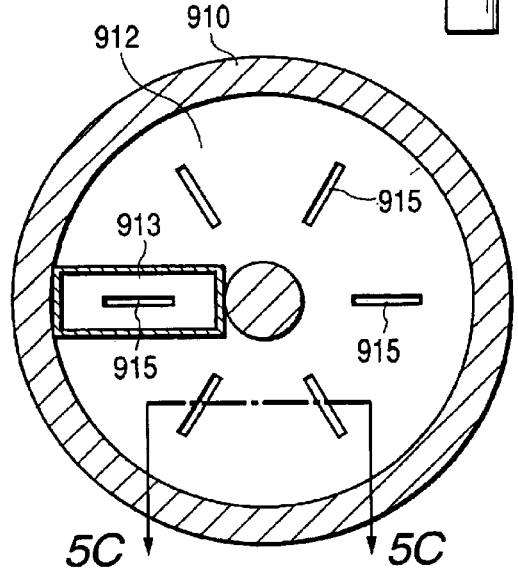
Figure 5C:
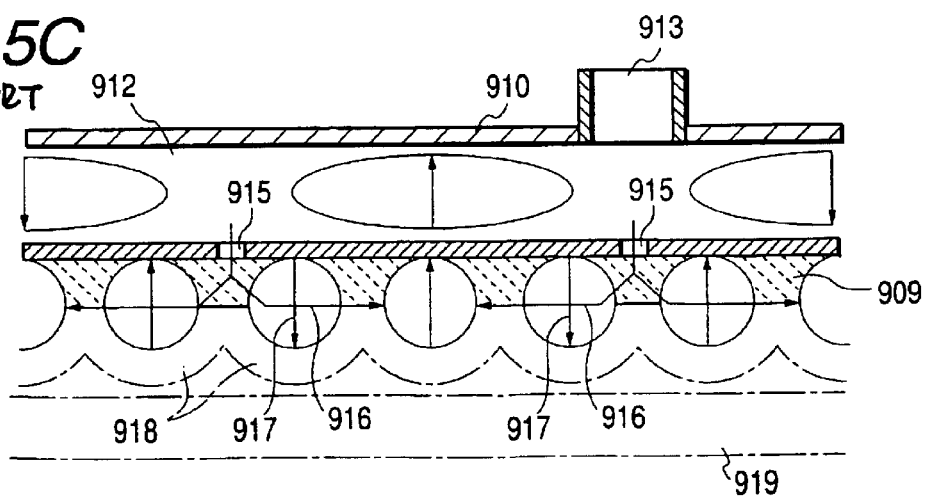

In the case of the conventional example shown in FIGS. 5A to 5C, for the uniform introduction of the microwave through the slots 915, the standing waves need to be uniformly generated within the annular waveguide 912. However, when the coupling degree through one slot changes due to the change in conditions such as the pressure and the microwave electric power, the deviation to the position near the introduction E distributor 913 or conversely, the deviation to the position far therefrom occurs, which becomes the cause of the nonuniformity in the circumferential direction.

In order to solve that nonuniformity, we considered that a plurality of introduction ports to the annular waveguide 912 may be provided so as to be symmetrical with respect to the axis, or a plurality of introduction ports may be provided by the number of loops of the standing wave 917 generated within the annular waveguide 912 if possible, e.g., eight introduction ports may be provided in the case of the annular waveguide 912 one circumferential length of which is 4 times as long as the wavelength inside the waveguide.

However, it is difficult to form a large number of introduction E distributor 913 in terms of construction and it is also not easy to distribute uniformly the microwave to the E distributors 913. Then, we devised that the microwave is introduced into the annular waveguide 912 not through any of the introduction E distributors but through the slots. In addition, we considered that the distribution to the input side slots is simple and convenient in the case of the annular waveguide and we have reached, as a result, the conclusion that the annular waveguide is made in the form of two-layer structure. Also, since it is desirable to uniformly introduce the microwave into the input side annular waveguide 111, we decided that the microwave is introduced which has been introduced through the introduction ports provided at predetermined intervals at the center of the annular waveguide in a circumferential direction. In particular, if the microwave is introduced after distribution using either the E-distribution waveguide or the H-distribution waveguide 113, then it becomes possible to introduce the microwave more uniformly. For this reason, it is desirable that the introduction ports are provided at intervals of 180 degrees.

In addition, it is desirable that the dimensions in cross section of the input side annular waveguide 111 are the same as those of the two-distribution waveguide 113 for input in terms of reduction of the right reflection. It is most efficient and desirable that the central diameter of the output side annular waveguide 112 is the same as that of the surface standing wave exciting slot.

Consequently, in this case, for the dimensions in cross section of the output side annular waveguide 112, the dimensions are desirable in which the wavelength inside the waveguide is given in such a way that the ratio of one circumferential length to the wavelength inside the waveguide of the output side annular waveguide 112 becomes equal to that of the input side annular waveguide 111. Since in general, the central diameter and the cross sectional dimensions of the input side annular waveguide 111 are different from those of the output side annular waveguide 112, it is desirable that the waveguide coupling slots 114 are formed in such a way that the coupling rate becomes sufficiently high in the part where both of the waveguides overlap each other.

The generation of the plasma and the surface processing for the arranged substrate are carried out in the following manner. The air in the plasma processing chamber 101 is vacuum-exhausted through the exhaust means 107. Subsequently, the plasma processing gas is introduced at predetermined flow rate into the plasma processing chamber 101 through the means 106 for introducing therethrough processing gas.

Next, the means 108 for adjusting a conductance which is provided between the plasma processing chamber 101 and the exhaust means 107 is adjusted to hold the inside of the plasma processing chamber 101 at a predetermined pressure. If necessary, the bias voltage is applied to the object 102 to be processed through the means 105 for applying a high-frequency bias. The desired electric power is supplied from a microwave power source (not shown) to the plasma processing chamber 101 through the annular non-terminal waveguide 110. In this connection, the microwave which has been introduced into the annular non-terminal waveguide 110 is distributed through the two-distribution waveguide 113 to be introduced into the input side annular waveguide 111 through the two ways and the microwaves thus introduced thereinto are propagated through the inside of the input side annular waveguide 111 to interfere with each other to generate roughly uniformly the standing waves having "the loop" at intervals of one half the wavelength inside the guide. The microwaves which have been introduced into the output side annular waveguide 112 through the waveguide coupling slots 114 also interfere with each other to generate "the loops" of the standing waves which are roughly perfectly uniform.

Each of the slots 115 in the present invention is preferably provided in the position where the magnitude of a current which is caused to flow through the slot plate becomes maximum. Then, the microwave which has been introduced through the output slots 115 provided in the annular non-terminal waveguide 112 into the plasma processing chamber 101 after permeation through the dielectric member 109 generates the plasma between the adjacent two standing waves in the vicinities of the slots 115. If the electron density of the generated plasma exceeds the cut-off density ($7 \times 10^{10}$ $cm^{-3}$ in the case of the power source frequency of 2.45 GHz) expressed by the following Expression;

$$n_{ec} = \epsilon_0 m_e \omega^2 / e^2$$

(where $\epsilon_0$ is vacuum permittivity, $m_e$ is the mass of an electron, $\omega$ is the power source angular frequency, and e is the charge of an electron), then the microwave becomes unable to be propagated through the plasma. Then, if the electron density further increases to exceed the threshold density ($3.4 \times 10^{11}$ $cm^{-3}$ in the case of quartz window ($\epsilon_d$: 3.8), and $7.6 \times 10^{11}$ $cm^{-3}$ in the case of the aluminum window ($\epsilon_d$: 9.8) of the right surface wave mode expressed by the following Expression;

$$n_{es} = (1+\epsilon_d)\epsilon_0 m_e \omega^2 / e^2$$

(where $\epsilon_d$ is the relative permittivity of the dielectric window) so that if the skin thickness expressed by the following Expression;

$$\delta = C/\omega_p = C(\epsilon_0 m_e / e^2 n_e)^{1/2} = (2/\omega\mu_0\sigma)^{1/2}$$

(where C is the light velocity, $\omega_p$ is the electron plasma angular frequency, $\mu_0$ is the vacuum permeability and $\delta$ is the plasma electric conductivity) becomes sufficiently thin (e.g. if the electron density becomes equal to or larger than $1 \times 10^{12}$ $cm^{-3}$, then the skin thickness becomes equal to or smaller than 10 mm), then the microwave is propagated on the surface of the dielectric 109 in the form of the surface wave 116. The surface waves 116 which have been respectively introduced through the adjacent output slots 115 interfere with each other to generate the loop of the surface standing waves 117 at intervals of one half the wavelength of the surface wave 116 which is expressed by the following expression:

$$\lambda_s = \lambda_w \{1-(\epsilon_0 m_e \omega_2 / e^2 n_e)^{1/2}\}$$

where $\lambda_w$ is the wavelength of the microwave in the dielectric window between the perfect conductors. The electrons are accelerated by the surface standing waves 117 which has been generated in the plasma processing chamber 101 after permeation of the microwave through the dielectric member 109 to generate the surface plasma 118.

Furthermore, the bulk plasma 119 is generated due to the diffusion of the surface plasma 118. Surface-wave Interfered Plasma (SIP) generated in such a manner has the two-layer structure consisting of the surface plasma 118 and the bulk plasma 119. At this time, if the processing gas is introduced into the plasma processing chamber 101 through the means 106 for introducing therethrough processing gas, then the processing gas is excited by the high-density plasma thus generated to process the surface of the object 102 to be processed placed on the supporting body 103.

As to a material of the annular non-terminal waveguide 110, any of materials is available as long as it is a conductor. However, for the purpose of suppressing the propagation loss of the microwave as much as possible, an SUS or the like which is obtained by plating a conductor with Al, Cu, or Ag/Cu having high electric conductivity is the most suitable material. As to the method of introducing the microwave, it is desirable that in order to enhance the axis symmetrical property of the antenna, the microwave is distributed into two parts at the center of the antenna to be introduced into the annular non-terminal waveguide 110 through the two introduction ports.

In the present invention, when the slots 114 each of which is provided between the waveguides are provided radially, and also the central radii of the waveguides are $r_{g2}$ and $r_{g1}$, respectively, the central radius $r_{s2}$ of each of the slots 114 substantially fulfills the following approximate Expression:

$$r_{s2} \cong (r_{g2}+r_{g1})/2$$

Then, the central radius $r_{g1}$ of the output side waveguide is substantially equal to the central radius rs1 of each of the slots 114 provided on the side of the plasma processing chamber 101. If the number of loops of the surface standing wave 117 excited between the adjacent slots is n1, the wavelength of the surface wave 116 is $\lambda s$ and the magnification of one circumferential length of the output side waveguide to the wavelength inside the waveguide of the microwave in the output side waveguide is ng, then the following approximate Expression is fulfilled:

$$r_{g1} \cong n_1 \lambda_s / 2s \tan[(\pi/2n_g)][1+\cos(\pi/n_g)]$$

In addition, if the wavelength inside the waveguide in the output side waveguide is $\lambda_{g1}$, then the length ls1 of each of the slots between the waveguides two by two is expressed by the following approximate Expression:

$$l_{s1} \cong \lambda_{g1}/4$$

When the intensity of the microwave introduced through the output slots 115 of the annular non-terminal waveguide 110 is wanted to be adjusted, an open angle of each of the slots may be changed or the internal external slots may be shifted together with each other radially without changing the interval thereof. The frequency of the microwave can be suitably selected in the range of 0.8 GHz to 20 GHz.

As to the materials for the dielectric member 109, there are suitable therefor SiO2-based quartz, various kinds of glass, and an inorganic material which is selected from the group consisting of $Si_3N_4$, NaCl, KCl, LiF, $CaF_2$, $BaF_2$, $Al_2O_3$, AlN and MgO. In addition thereto, there is also available an organic film or sheet made of a material which is selected from the group consisting of polyethlene, polyester, polycarbonate, cellulose acetate, polypropylene, polyvinyl chloride, polyvinylidene chloride, polystyrene, polyamide, and polyimide.

Magnetic field generating means may be used. While as to the magnetic field used in the present embodiment, Miller magnetic field or the like may be applied, the magnetron magnetic field in which the magnetic flux density of the magnetic field in the vicinity of each of the slots 115 is larger than that of the magnetic field in the vicinity of the substrate 102 is the most suitable magnetic field. As to the magnetic field generating means, even a permanent magnet may also be available in addition to a coil. When a coil is used as the magnetic field generating means, in order to prevent the over-heating, a water cooling mechanism or other cooling means such as air cooling may be used.

In addition, in order to further promote the high quality for the processing, the surface of the substrate may be irradiated with ultraviolet light. As to the light source, any of an excimer laser, an excimer lamp, rare gas resonance line lamp, a low-pressure mercury lamp, and the like is suitable as long as it emits light which is absorbed by gas adhered onto the object 102 to be processed or the substrate 102.

The pressure in the plasma processing chamber 101 can be selected from the range of $1.33 \times 10^{-2}$ Pa to $1.33 \times 10^3$ Pa, more preferably from the range of $1.33 \times 10^{-1}$ Pa to 13.3 Pa in the case of the CVD, from the range of 13.3 Pa to $1.33 \times 10^2$ Pa in the case of the isolation CVD, from the range of $6.65 \times 10^{-3}$ Pa to $6.65 \times 10^{-2}$ Pa in the case of the etching, and from the range of 13.3 Pa to $1.33 \times 10^2$ Pa in the case of the ashing.

As to the formation of a deposited film, various deposited films such as insulating films of $Si_3N_4$, $SiO_2$, $Ta_2O_5$, $TiO_2$, TiN, $Al_2O_3$, AlN, $MgF_2$, or the like; semiconductor films of a-Si, poly-Si, SiC, GaAs, or the like; and metal films of Al, W, Mo, Ti, Ta, or the like can be efficiently formed by appropriately selecting a gas to be used.

The object 102 to be processed may be a semiconductor material, an electrically conductive material or an electrically insulating material.

Examples of the conductive substrate include metals such as Fe, Ni, Cr, Al, Mo, Au, Nb, Ta, V, Ti, Pt, and Pb, or alloys thereof such as brass and stainless steel.

Examples of the insulating substrate include: $SiO_2$-based quartz or various glasses; inorganic materials such as $Si_3N_4$, NaCl, KCl, LiF, $CaF_2$, $BaF_2$, $Al_2O_3$, AlN, and MgO; and a film or sheet made of an organic material which is selected from the group consisting of polyethylene, polyester, polycarbonate, cellulose acetate, polypropylene, polyvinyl chloride, polyvinylidene chloride, polystyrene, polyamide, and polyimide.

As to the gas used when a thin film is formed on the substrate 102 by utilizing the CVD method, in general, the known gas can be used.

Examples of the material gas containing Si atom which is introduced into the plasma processing chamber 101 through processing gas introduction means 106 in case of forming an Si-based semiconductor thin film such as a-Si, poly-Si, or SiC. include: a material which is in the gaseous state at normal temperatures and pressures or a material which can easily be gasified, for example, inorganic silanes such as $SiH_4$, and $Si_2O_6$; organic silanes such as tetraethylsilane (TES), tetramethylsilane (TMS), dimethylsilane (DES), dimethylfluorosilane (DMDFS), and dimethylchlorosilane (DMDCS); and halosilanes such as $SiF_4$, $Si_2OF_6$, $Si_3F_8$, $SiHF_3$, $SiH_2F_2$, $SiCl_4$, $Si_2Cl_6$, $SiHCl_3$, $SiH_2Cl_2$, $SiH_3Cl$, and $SiCl_2F_2$. In addition, examples of the gas to be added or the carrier gas which may be mixed with Si material gas and introduced, in this case include $H_2$, He, Ne, Ar, Kr, Xe, and Rn.

Examples of the raw materials containing Si atom which is introduced though the processing gas introduction means 106 in case of forming an Si compound-based thin film such as $Si_3N_4$ or $SiO_2$ include: a material which is in the gaseous state at normal temperatures and pressures or a material which can easily be gasified, for example, inorganic silanes such as $SiH_4$ and $Si_2H_6$; organic silanes such as tetraethoxysilane (TEOS), tetramethoxysilane (TMOS), octamethylcyclotetrasilane (OMCTS), dimethylfluorosilane (DMDFS), and dimethyldichlorosilane (DMDCS); and halosilanes such as $SiF_4$, $Si_2F_6$, $Si_3F_8$, $SiHF_3$, $SiH_2F_2$, $SiCl_4$, $Si_2Cl_6$, $SiHCl_3$, $SiH_2Cl_2$, $SiH_3Cl$, and $SiCl_2F_2$. In addition, examples of the nitrogen material gas or the oxygen-based gas which is introduced simultaneously, in this case, include $N_2$, $NH_3$, $N_2H_4$, hexamethyldisilazane (HMDS), $O_2$, $O_3$, $H_2O$, NO, $N_2O$, and $NO_2$.

Examples of the raw materials containing a metal atom which is introduced though the processing gas introduction means 106 in case of forming a metal thin film such as Al, W, Mo, Ti, or Ta include: organic materials such as trimethylaluminum (TMAI), triethylaluminum (TEAI), triisobutylaluminum (TIBAI), dimethylaluminumhydride (DMAIH), tungsten carbonyl ($W(CO)_6$), molybdenum carbonyl ($W(CO)_6$), trimethyl gallium (TMGa), triethyl gallium (TEGa), tetraisopropoxytitanium (TIPOTi), and pentaethoxytantalum (PEOTa) and; halide metals such as $AlCl_3$, $WF_6$, $TiCl_3$, and $TaCl_5$. In addition, examples of the gas to be added or the carrier gas which may be mixed with Si material gas and introduced, in this case include $H_2$, He, Ne, Ar, Kr, Xe, and Rn.

Examples of the raw materials containing a metal atom which is introduced though the processing gas introduction means 106 in case of forming a metal compound thin film made from $Al_2O_3$, AlN, $Ta_2O_5$, $TiO_2$, TiN, or $WO_3$ include: organic materials such as trimethylaluminum (TMAI), triethylaluminum (TEAI), triisobutylaluminum (TIBAI), dimethylaluminumhydride (DMAIH), tungsten carbonyl ($W(CO)_6$), molybdenum carbonyl ($W(CO)_6$), trimethyl gallium (TMGa), triethyl gallium (TEGa), tetraisopropoxytitanium (TIPOTi), and pentaethoxytantalum (PEOTa) and; halide metals such as $AlCl_3$, $WF_6$, $TiCl_3$, and $TaCl_5$. In addition, examples of the nitrogen material gas or the oxygen material gas which is introduced simultaneously, in this case, include $O_2$, $O_3$, $H_2O$, NO, $N_2O$, $NO_2$, $NH_3$, $N_2H_4$, and hexamethyldisilazane (HMDS).

Examples of the etching gas which is introduced from the processing gas introduction port 106 in case of etching the substrate surface include $F_2$, $CF_4$, $CH_2F_2$, $C_2F_6$, $C_4F_8$, $CF_2Cl_2$, $SF_6$, $NF_3$, $Cl_2$, $CCl_4$, $CH_2Cl_2$, $C_2Cl_6$, $O_2$, $N_2$, $NH_3$, and $H_2$.

As to the gas for ashing which is introduced through the processing gas introduction ports 106 when an organic constituent on the surface of the substrate such as a photo resist film is ashed and removed, $O_2$, $O_3$, $H_2O$, $H_2$, NO, $N_2O$, $NO_2$ or the like is given as an example.

In addition, when the microwave plasma processing system and the surface processing method are applied to the surface reforming as well, gas to be used is suitably selected, whereby for example, Si, Al, Ti, Zn, Ta or the like is used as the substrate 102 or the surface layer and the oxidation processing, the nitriding processing, or the doping processing using B, As, P or the like of the substrate 102 or the surface layer is possible. Furthermore, the adopted film forming technique may also be applied to the cleaning method as well. In this case, that technique may be used in the cleaning of oxide, an organic substance, heavy metal, or the like.

As to the oxidizing gas which is introduced through the processing gas introduction ports 106 when the surface of the substrate 102 is intended to be oxidized, $O_2$, $O_3$, $H_2O$, NO, $N_2O$, $NO_2$ or the like is given as an example. In addition, as to the nitriding gas which is introduced through the processing gas introduction ports 106 when the substrate 102 is intended to be nitrided, $N_2$, $NH_3$, $N_2H_4$, hexamethyldisilazane (HMDS) or the like is given as an example.

As to the cleaning/ashing gas which is introduced through the processing gas introduction ports 106 when an organic substance on the surface of the substrate 102 is intended to be cleaned, or when an organic constituent on the surface of the substrate 102 such as a photo resist film is intended to be ashed and removed, $O_2$, $O_3$, $H_2O$, $H_2$, NO, $N_2O$, $NO_2$ or the like is given as an example. In addition, as to the cleaning gas which is introduced through the processing gas introduction ports 106 when an inorganic material on the surface of the substrate 102 is intended to be cleaned, $F_2$, $CF_4$, $CH_2F_2$, $C_2F_6$, $C_4F_8$, $CF_2Cl_2$, $SF_6$, $NF_3$ or the like is given as an example.

When embodiments of the present invention will hereinafter be described more specifically, the present invention is not intended to be limited thereto.

(Embodiment 1)

The description will hereinbelow be given with respect to an embodiment in the case where the magnification ng of the waveguide circumferential length to the wavelength inside the waveguide is 4, the number n1 of the surface standing waves between the slots two by two is 3, and the dielectric member is made of quartz ($\in_d$: 3.8) with reference to FIGS. 2A to 2C.

Figure 2A:
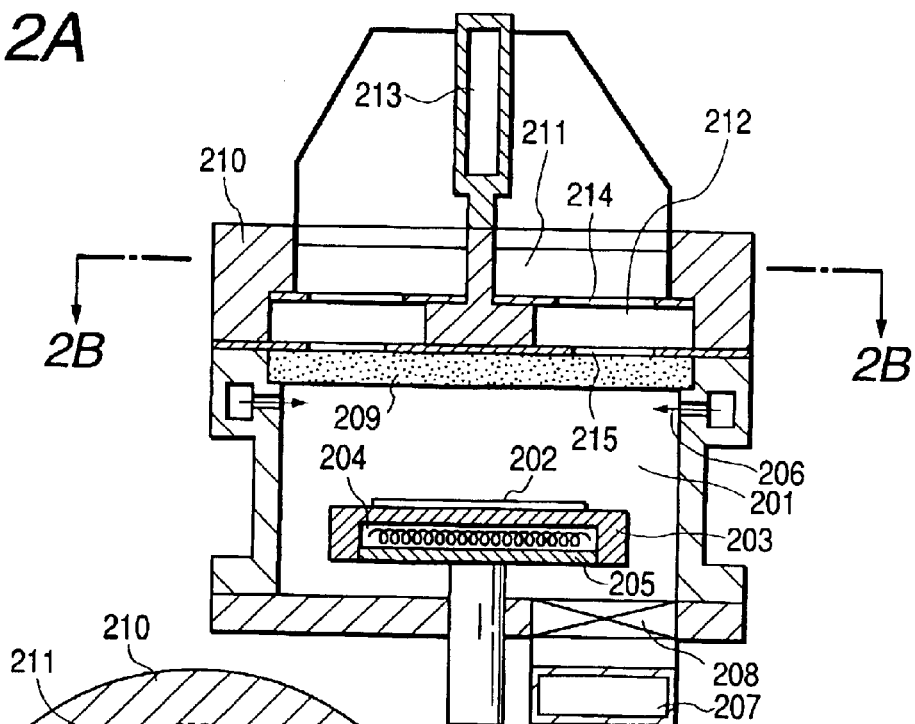
FIGS. 2A, 2B and 2C are respectively a cross sectional view and a schematic view showing a microwave plasma processing system employing a 4 λgDMA antenna for generating three standing waves by excitation using a quartz window according to an embodiment of the present invention.
Figure 2B:
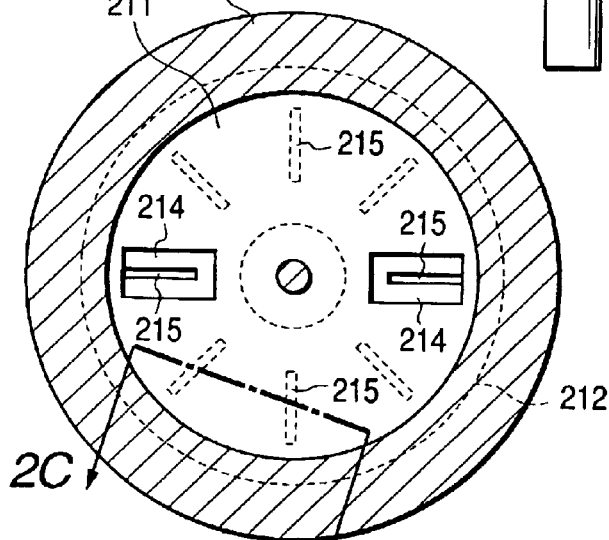
Figure 2C:
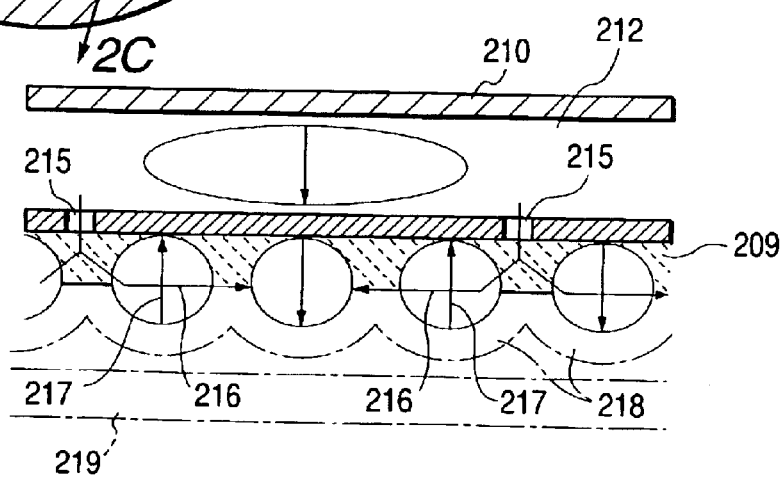

In FIGS. 2A to 2C, reference numeral 201 designates a plasma processing chamber; reference numeral 202 designates an object to be processed; reference numeral 203 designates a supporting body for supporting the substrate 202; reference numeral 204 designates means for adjusting a temperature of the substrate 202; reference numeral 205 designates means for applying a high-frequency bias; reference numeral 206 designates means for introducing therethrough processing gas; reference numeral 207 designates exhaust means; reference numeral 208 designates means for adjusting an exhaust conductance; reference numeral 209 designates a dielectric member for separating therethrough the plasma processing chamber 201 from the atmosphere side; reference numeral 210, an annular non-terminal waveguide with slots having two-layer structure for introducing the microwave into the plasma processing chamber 201 after permeation through the dielectric member 209; reference numeral 211, an input side annular waveguide within the annular non-terminal waveguide 210 having two-layer structure; reference numeral 212, an output side annular waveguide within the annular non-terminal waveguide having two-layer structure; reference numeral 213, an E-distribution waveguide for introducing the microwave through two introduction ports of the input side annular waveguide 211; reference numeral 214, a waveguide coupling slot for coupling the input side annular waveguide 211 and the output side annular waveguide 212 to each other; reference numeral 215, an output side slot; reference numeral 216, a surface wave which is introduced through the output side slots to be propagated on the surface of the dielectric member 209; reference numeral 217, a surface standing wave which is generated due to the interference between the surface waves 216 which are introduced through the adjacent slots; 218, surface plasma which is generated due to the presence of the surface standing waves; and 219, bulk plasma which is generated due to the diffusion of the surface plasma.

The generation of the plasma and the surface processing are carried out in the following manner. The air in the plasma processing chamber 201 is vacuum-exhausted through the exhausted means 207. Subsequently, the plasma processing gas is introduced at predetermined flow rate into the plasma processing chamber 201 through the means 206 for introducing therethrough processing gas. Next, the means 208 for adjusting a exhaust conductance which is provided between the plasma processing chamber 201 and the exhaust means 207 is adjusted to hold the inside of the plasma processing chamber 201 at a predetermined pressure. If necessary, a bias voltage is applied to the object 202 to be processed through the means for applying a high-frequency bias 205.

The desired electric power is applied from a microwave power source (not shown) to the plasma processing chamber 201 through the annular non-terminal waveguide 210. In this connection, the microwave which has been introduced into the annular non-terminal waveguide 210 is distributed by the E-distribution waveguide 213 to be introduced into the input side annular waveguide 211 through the two ways and the microwaves thus introduced thereinto are then propagated through the input side annular waveguide 211 to interfere with each other to roughly uniformly generate the standing waves each having "the loop" at intervals of one half the wavelength inside the waveguide. The microwaves which have been introduced into the output side annular waveguide 212 through the waveguide coupling slots 214 also interfere with each other to generate "the loops" of the roughly perfectly uniform standing waves.

The microwaves which have been introduced from the output slots 214 into the plasma processing chamber 201 after permeation through the dielectric member 209 generate the plasma in the vicinities of the slots 214. If the electron density of the plasma thus generated exceeds the cut-off density ($7 \times 10^{10}$ cm$^{-3}$ in the case of the power source frequency of 2.45 GHz) expressed by the following Expression;

$$n_{ec} = \in_0 m_e \omega^2 / e^2$$

(where $\in_0$ is the vacuum permittivity, $m_e$ is the mass of an electron, $\omega$ is the power source angular frequency, and e is the charge of an electron), then the microwave becomes unable to be propagated through the plasma. If the electron density further increases to exceed the threshold density of right surface wave mode ($3.4 \times 10^{11}$ cm$^{-3}$ in the case of the quartz window ($\in_d$: 3.8)) expressed by the following Expression;

$$n_{es} = (1 + \in_d) \in_0 m_e \omega^2 / e^2$$

(where $\in_d$ is the relative permittivity of the dielectric window) and then the skin thickness which is expressed by the following Expression;

$$\delta = C/\omega_p = C(\in_0 m_e/e^2 n_e)^{1/2} = (2/\omega \mu_0 \sigma)^{1/2}$$

(where C is light velocity, $\omega_p$ is the electron plasma angular frequency, $\mu_0$ is the vacuum permeability, and $\sigma$ is the electric conductivity of the plasma) becomes sufficiently thin (e.g., if the electron density becomes equal to or larger than $1 \times 10^{12}$ cm$^{-3}$, then the skin thickness becomes equal to or smaller than 10 mm), then the microwave is propagated on the surface of the dielectric 209 in the form of the surface wave 216. The surface waves 216 which have been introduced through the adjacent output slots 215 interfere with each other to generate the loop of each of the surface standing waves 217 at intervals of one half the wavelength of the surface wave 216 which is expressed by the following Expression:

$\lambda_s = \lambda_w \{1-(\in_0 n_e \omega^2/e^2 n_e)^{1/2}\}$ (where $\lambda_w$ is the microwave wavelength in the dielectric window between the perfect conductors). The electrons are accelerated due to the surface standing wave 217 which has been generated in the plasma processing chamber 201 after permeation of the microwave through the dielectric member 209 to generate the surface plasma 218. Furthermore, the bulk plasma 219 is generated due to the diffusion of the surface plasma 218.

Surface-wave Interfered Plasma (SIP) thus generated has the two-layer structure consisting of the surface plasma 218 and the bulk plasma 219. At this time, if the processing gas is introduced into the plasma processing chamber 201 through the means 206 for introducing therethrough plasma gas, then the processing gas is excited by the generated high-density plasma to process the surface of the object 202 to be processed which is placed on the supporting body 203.

The quartz window 209 is made of anhydrous composite quartz which has a diameter of 378 mm and a thickness of 16 mm. The annular non-terminal waveguide 210 having two-layer structure, in order to suppress the propagation loss of the microwave, is made of aluminum. The input side annular waveguide 211 in the annular non-terminal waveguide is 27 mm×96 mm in cross sectional dimensions and is 202.2 mm in central diameter (the circumferential length of the waveguide is 4 times as large as the wavelength inside the waveguide).

The output side annular waveguide 212 is 27 mm×80.4 mm in cross sectional dimensions and is 240 mm in central diameter (the circumferential length of the waveguide is 4 times as large as the wavelength inside the waveguide (188.5 mm)). The eight waveguide coupling slots 214 are radially formed in the dimensions of 50 mm×4 mm on the circle at a distance of 228.9 mm away from the center of the overlapping part (its radius is in the range of 79.8 mm to 149.1 mm) between the input side annular waveguide 211 and the output side annular waveguide 212. Likewise, the eight output slots 215 are radially formed in the dimensions of 52 mm×4 mm on the circle where its central radius of 240 mm is the same as that of the output side annular waveguide 212. A 4E tuner, a directional coupler, an isolator, and a microwave power source (not shown) having a frequency of 2.45 GHz are connected in this order to the two-distribution waveguide 213.

The plasma was generated under the conditions in which a flow rate of Ar is 500 sccm, a pressure is 13.3×10⁻² Pa, and the microwave electric power is 3.0 kW using the microwave plasma processing system shown in FIGS. 2A to 2C and the resultant plasma was measured.

The measurement of the plasma was carried out on the basis of the single probe method in the following manner. The voltage applied to the probe was changed in the range of −10V to +30V, the current which is caused to flow through the probe was measured with an I-V measurement apparatus, and the electron density, the electron temperature and the plasma potential were respectively calculated from the resultant I-V characteristic curve on the basis of the method by Langmuir or the like.

It was, as a result of the measurement, confirmed that the electron density is $2.1 \times 10^{12}$/cm³±2.9% (within Φ300 plane) in the case of the pressure of 13.3×10⁻² Pa and hence the uniform and stable plasma having the high electron density was formed.

(Embodiment 2)

The description will hereinbelow be given with respect to an embodiment in the case where the magnification $n_g$ of the waveguide circumferential length to the wavelength inside the waveguide is 3, the number n1 of the surface standing waves between the slots two by two is 3, and the dielectric member is made of quartz ($\in_d$: 3.8) with reference to FIGS. 3A to 3C. Reference numeral 301 designates a plasma processing chamber; reference numeral 302 designates an object to be processed; reference numeral 303 designates a supporting body for supporting the substrate 302; reference numeral 304 designates means for adjusting a temperature of the substrate 302; reference numeral 305 designates means for applying a high-frequency bias; reference numeral 306 designates means for introducing therethrough processing gas; reference numeral 307 designates exhaust means; reference numeral 308 designates means for adjusting an exhaust conductance; reference numeral 309 designates a dielectric member for separating therethrough the plasma processing chamber 301 from the atmosphere side; reference numeral 310, an annular non-terminal waveguide with slots having two-layer structure for introducing the microwave into the plasma processing chamber 301 after permeation through the dielectric member 309; reference numeral 311, an input side annular waveguide within the annular non-terminal waveguide 310 having two-layer structure; reference numeral 312, an output side annular waveguide within the annular non-terminal waveguide having two-layer structure; reference numeral 313, an H-distribution waveguide for introducing the microwave through two introduction ports of the input side annular waveguide 311; reference numeral 314, a waveguide coupling slot bored to be provided between the input side annular waveguide 311 and the output side annular waveguide 312 for coupling the waveguides to each other; reference numeral 315, an output side slot provided on the plasma processing chamber side of the annular non-terminal waveguide 310; reference numeral 316, a surface wave which is introduced through the output side slots to be propagated on the surface of the dielectric member 309; reference numeral 317, a surface standing wave which is generated due to the interference between the surface waves 316 which are introduced through the adjacent slots; 318, surface plasma which is generated due to the presence of the surface standing waves 317; and 319, bulk plasma which is generated due to the diffusion of the surface plasma.

The generation of the plasma and the surface processing thereof are carried out in the following manner. The air in the plasma processing chamber 301 is vacuum-exhausted through the exhaust means 307. Subsequently, the plasma processing gas is introduced at a predetermined flow rate into the plasma processing chamber 301 through the means 306 for introducing therethrough processing gas.

Next, the means 308 for adjusting an exhaust conductance which is provided between the plasma processing chamber 301 and the exhaust means 307 is adjusted to hold the inside of the plasma processing chamber 301 at a predetermined pressure. If necessary, a bias voltage is applied to the object 302 to be processed through the high-frequency bias applying means 305. The desired electric power is applied from a microwave power source (not shown) to the plasma processing chamber 301 through the annular non-terminal waveguide 310. At this time, the microwave which has been introduced into the annular non-terminal waveguide 310 is distributed by the H-distribution waveguide 313 to be introduced into the input side annular waveguide 311 through the two introduction ports and the microwaves thus introduced thereinto are then propagated through the input side annular waveguide 311 to interfere with each other to generate substantially uniform standing waves each having "the loop" at intervals of one half the wavelength inside the waveguide.

The microwaves which have been introduced into the output side annular waveguide 312 through the waveguide coupling slots 314 also interfere with each other to generate "the loops" of the almost perfectly uniform standing waves.

The microwaves which have been introduced from the output slots 314 into the plasma processing chamber 301 after permeation through the dielectric member 309 generate the plasma in the vicinities of the slots 314. If the electron density of the plasma thus generated exceeds the cut-off density ($7 \times 10^{10}$ cm$^{-3}$ in the case of the power source frequency of 2.45 GHz) expressed by the following Expression;

$$n_{ec} = \epsilon_0 m_e \omega^2 / e^2$$

(where $\epsilon_0$ is the vacuum permittivity, $m_e$ is the mass of an electron, $\omega$ is the power source angular frequency, and e is the charge of an electron), then the microwaves become unable to be propagated through the plasma. If the electron density further increases to exceed the threshold density of right surface wave mode ($3.4 \times 10^{11}$ cm$^{-3}$ in the case of the quartz window ($\epsilon_d$: 3.8) and $7.6 \times 10^{11}$ cm$^{-3}$ in the case of the aluminum nitride window ($\epsilon_d$: 9.8)) expressed by the following Expression;

$$n_{es} = (1 + \epsilon_d) \epsilon_0 m_e \omega^2 / e^2$$

(where $\epsilon_d$ is the relative permittivity of the dielectric window) so that if the skin thickness expressed by the following Expression;

$$\delta = C / \omega_p = C (\epsilon_0 m_e / e^2 n_e)^{1/2} = (2/\omega \mu_0 \sigma)^{1/2}$$

(where C is light velocity, $\omega_p$ is the electron plasma angular frequency, $\mu_0$ is the vacuum permeability, and $\delta$ is the electric conductivity of the plasma) becomes sufficiently thin (e.g., if the electron density becomes equal to or larger than $1 \times 10^{12}$ cm$^{-3}$, then the skin thickness becomes equal to or smaller than 10 mm), then the microwave is propagated on the surface of the dielectric 309 in the form of the surface wave 316. The surface waves 316 which have been introduced through the adjacent output slots 315 interfere with each other to generate the loop of each of the surface standing waves 317 at intervals of one half the wavelength of the surface wave 316 which is expressed by the following Expression:

$$\lambda_s = \lambda_w \{1 - (\epsilon_0 m_e \omega^2 / e^2 n_e)^{1/2}\}$$

(where $\lambda_w$ is the microwave wavelength in the dielectric window between the perfect conductors). The electrons are accelerated due to the surface standing wave 317 which has been generated in the plasma processing chamber 301 after permeation of the microwave to generate the surface plasma 318. Furthermore, the bulk plasma 319 is generated due to the diffusion of the surface plasma 318.

Surface-wave Interfered Plasma (SIP) thus generated has the two-layer structure consisting of the surface plasma 318 and the bulk plasma 319. At this time, if the processing gas is introduced into the plasma processing chamber 301 through the means 306 for introducing therethrough plasma gas, then the processing gas is excited by the generated high-density plasma to process the surface of the object 302 to be processed which is placed on the supporting body 303.

The quartz window 309 was made of anhydrous composite quartz which has a diameter of 330 mm and a thickness of 16 mm. The annular non-terminal waveguide 310 having two-layer structure, in order to suppress the propagation loss of the microwave, is made of aluminum. The input side annular waveguide 311 in the annular non-terminal waveguide is 27 mm×96 mm in cross sectional dimensions and is 151.6 mm in central diameter (the circumferential length of the waveguide is 3 times as large as the wavelength inside the waveguide). The output side annular waveguide 312 is 27 mm×74 mm in cross sectional dimensions and is 208 mm in central diameter (the circumferential length of the waveguide is 3 times as large as the wavelength inside the waveguide (217.8 mm)). The six waveguide coupling slots 314 are radially formed in the dimensions of 50 mm×4 mm on the circle at a distance of 95.4 mm away from the center of the overlapping part (its radius is in the range of 67 mm to 123.8 mm) between the input side annular waveguide 311 and the output side annular waveguide 312. The output slots 315 are formed in the dimensions of 56 mm×4 mm on the circle where its central radius of 208 mm is the same as that of the output side annular waveguide 312. A 4E tuner, a directional coupler, an isolator, and a microwave power source (not shown) having a frequency of 2.45 GHz are connected in this order to the H-distribution waveguide 313.

Figure 3A:
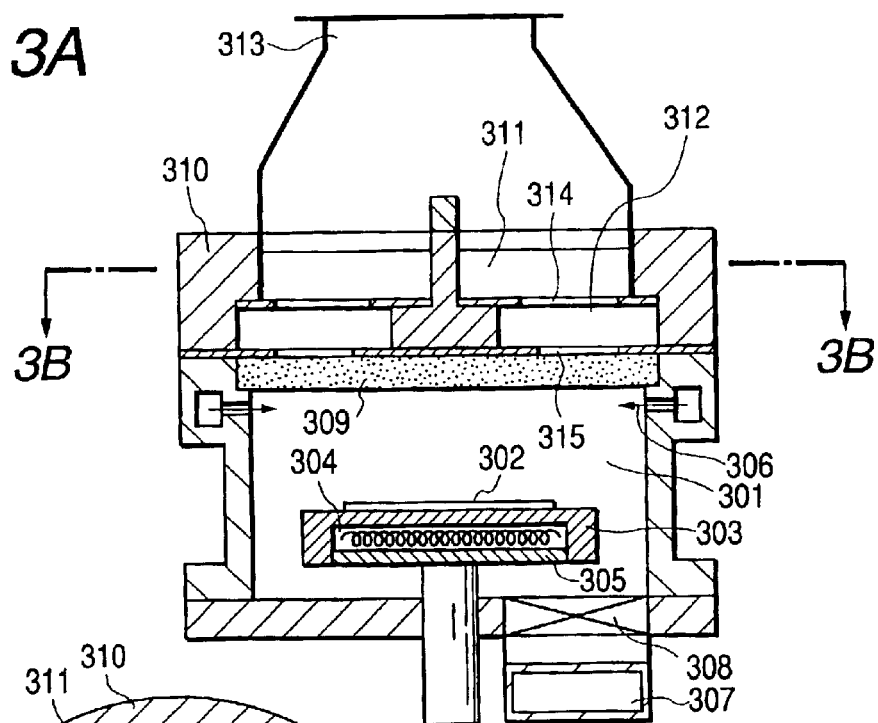
FIGS. 3A, 3B and 3C are respectively a cross sectional view and a schematic view showing a microwave plasma processing system employing a 4 λgDMA antenna for generating three standing waves by excitation using a quartz window according to another embodiment of the present invention.
Figure 3B:
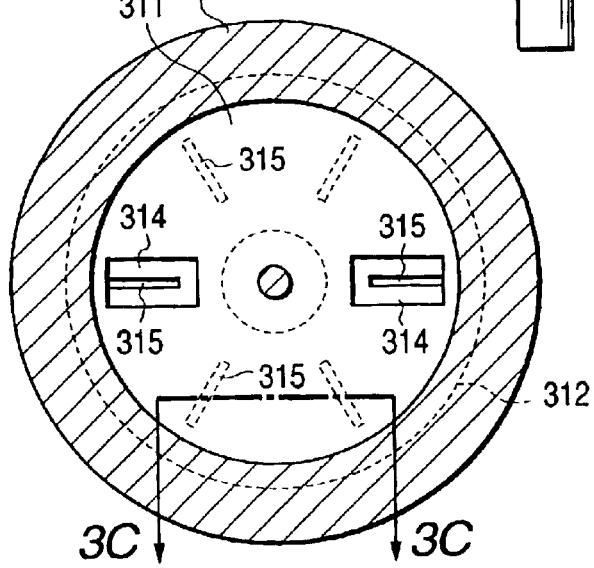
Figure 3C:
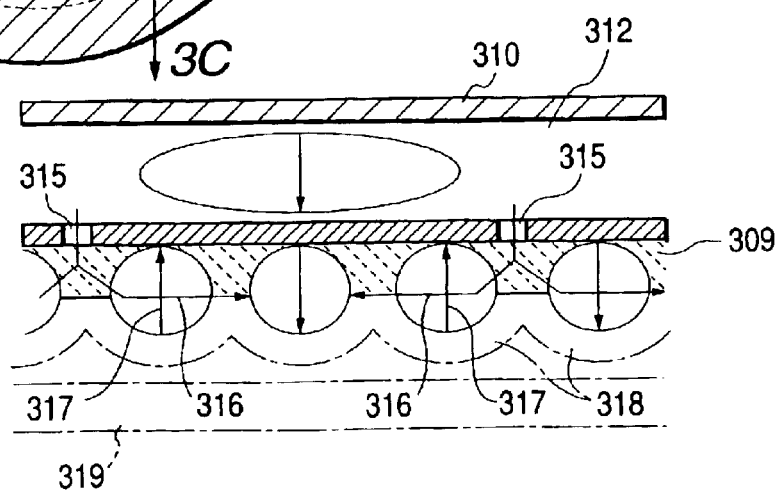

The plasma was generated under the conditions in which a flow rate of Ar is 500 sccm, a pressure is 13.3 Pa, and the microwave electric power is 3.0 kW using the microwave plasma processing system shown in FIGS. 3A to 3C and the resultant plasma was measured.

The measurement of the plasma was carried out on the basis of the single probe method in the following manner. The voltage applied to the probe was changed in the range of −10V to +30V, the current which is caused to flow through the probe was measured with an I-V measurement apparatus, and the electron density, the electron temperature and the plasma potential were respectively calculated from the resultant I-V characteristic curve on the basis of the method by Langmuir or the like.

It was, as a result of the measurement, confirmed that the electron density is $3.1 \times 10^{12}$/cm$^3 \pm 3.9\%$ (within Φ300 plane) in the case of the pressure of 13.3 Pa and hence the uniform and stable plasma having the high electron density was formed.

(Embodiment 3)

The description will hereinbelow be given with respect to an example of an apparatus in the case where the magnification $n_g$ of the waveguide circumferential length to the wavelength inside the waveguide is 3, the number $n_1$ of the surface standing waves between the slots two by two is 5, and the dielectric member is made of AlN ($\epsilon_d$: 9.8) with reference to FIGS. 4A to 4C. Reference numeral 401 designates a plasma processing chamber; reference numeral 402 designates an object to be processed; reference numeral 403 designates a supporting body for supporting the substrate 402; reference numeral 404 designates means for adjusting a temperature of the substrate 402; reference numeral 405 designates means for applying a high-frequency bias; reference numeral 406 designates means for introducing therethrough processing gas; reference numeral 407 designates exhaust means; reference numeral 408 designates means for adjusting an exhaust conductance; reference numeral 409 designates a dielectric member for separating therethrough the plasma processing chamber 401 from the atmosphere side; reference numeral 410, an annular non-terminal waveguide with slots having two-layer structure for introducing the microwave into the plasma processing chamber 401 after permeation through the dielectric member 409; reference numeral 411, an input side annular waveguide within the annular non-terminal waveguide 410 having two-layer structure; reference numeral 412, an output side annular waveguide within the annular non-terminal waveguide having two-layer structure; reference numeral 413, an H-distribution waveguide for introducing the microwave through two introduction ports of the input side annular waveguide 411; reference numeral 414, a waveguide coupling slot for coupling the input side annular waveguide 411 and the output side annular waveguide 412 to each other; reference numeral 415, an output side slot; reference numeral 416, a surface wave which is introduced through the output side slots to be propagated on the surface of the dielectric member 409; reference numeral 417, a surface standing wave which is generated due to the interference between the surface waves 416 which are introduced through the adjacent slots; 418, surface plasma which is generated due to the presence of the surface standing waves; and 419, bulk plasma which is generated due to the diffusion of the surface plasma.

The generation of the plasma and the surface processing thereof are carried out in the following manner. The air in the plasma processing chamber 401 is vacuum-exhausted through the exhaust means 407. Subsequently, the plasma processing gas is introduced at a predetermined flow rate into the plasma processing chamber 401 through the means 406 for introducing therethrough processing gas. Next, the means 408 for adjusting an exhaust conductance which is provided between the plasma processing chamber 401 and the exhaust means 407 is adjusted to hold the inside of the plasma processing chamber 401 at a predetermined pressure.

If necessary, a bias voltage is applied to the object 402 to be processed through the high-frequency bias applying means 405. The desired electric power is applied from a microwave power source (not shown) to the plasma processing chamber 401 through the annular non-terminal waveguide 410. In this connection, the microwave which has been introduced into the annular non-terminal waveguide 410 is distributed by the H-distribution waveguide 413 to be introduced into the input side annular waveguide 411 through the two introduction ports and the microwaves thus introduced thereinto are then propagated through the input side annular waveguide 411 to interfere with each other to generate substantially uniform standing waves each having "the loop" at intervals of one half the wavelength inside the waveguide. The microwaves which have been introduced into the output side annular waveguide 412 through the waveguide coupling slots 414 also interfere with each other to generate "the loops" of the almost perfectly uniform standing waves.

The microwaves which have been introduced from the output slots 414 into the plasma processing chamber 401 after permeation through the dielectric member 409 generate the plasma in the vicinities of the slots 414. If the electron density of the plasma thus generated exceeds the cut-off density ($7 \times 10^{10}$ cm$^{-3}$ in the case of the power source frequency of 2.45 GHz) expressed by the following Expression;

$$n_{ec} = \epsilon_0 m_e \omega^2 / e^2$$

(where $\epsilon_0$ is the vacuum permittivity, $m_e$ is the mass of an electron, $\omega$ is the power source angular frequency, and e is the charge of an electron), then the microwave becomes unable to be propagated through the plasma. Then, if the electron density further increases to exceed the threshold density of right surface wave mode ($7.6 \times 10^{11}$ cm$^{-3}$ in the case of the AlN window ($\epsilon_d$: 9.8)) expressed by the following Expression;

$$n_{es} = (1+\epsilon_d) \epsilon_0 m_e \omega^2 / e^2$$

(where $\epsilon_d$ is the relative permittivity of the dielectric window) so that if the skin thickness expressed by the following Expression;

$$\delta = C/\omega_p = C(\epsilon_0 m_e / e^2 n_e)^{1/2} = (2/\omega \mu_0 \sigma)^{1/2}$$

(where C is light velocity, $\omega_p$ is the electron plasma angular frequency, $\mu_0$ is the vacuum permeability, and $\delta$ is the electric conductivity of the plasma) becomes sufficiently thin (e.g., if the electron density becomes equal to or larger than $1 \times 10^{12}$ cm$^{-3}$, then the skin thickness becomes equal to or smaller than 10 mm), then the microwave is propagated on the surface of the dielectric 409 in the form of the surface wave 416. The surface waves 416 which have been introduced through the adjacent output slots 415 interfere with each other to generate the loop of each of the surface standing waves 417 at intervals of one half the wavelength of the surface wave 416 which is expressed by the following Expression:

$$\lambda_s = \lambda_w \{1 - (\epsilon_0 m_e \omega^2 / e^2 n_e)^{1/2}\}$$

(where $\lambda_w$ is the microwave wavelength in the dielectric window between the perfect conductors). The electrons are accelerated due to the surface standing wave 417 which has been generated in the plasma processing chamber 401 after permeation of the microwave through the dielectric member 409 to generate the surface plasma 418. Furthermore, the bulk plasma 419 is generated due to the diffusion of the surface plasma 418.

Surface-wave Interfered Plasma (SIP) thus generated has the two-layer structure consisting of the surface plasma 418 and the bulk plasma 419. At this time, if the processing gas is introduced into the plasma processing chamber through the means 406 for introducing therethrough plasma gas, then the processing gas is excited by the generated high-density plasma to process the surface of the object 402 to be processed which is placed on the supporting body 403.

The AlN window 409 was made by using a high-heat conduction type with a yttria assistant which has a diameter of 320 mm and a thickness of 10 mm. The whole annular non-terminal waveguide 401, in order to suppress the propagation loss of the microwave, is made of aluminum. The input side annular waveguide 411 in the annular non-terminal waveguide is 27 mm×96 mm in cross sectional dimensions and is 151.6 mm in central diameter (the circumferential length of the waveguide is 3 times as large as the wavelength inside the waveguide).

The output side annular waveguide 412 is 27 mm×73 mm in cross sectional dimensions and is 214 mm in central diameter (the circumferential length of the waveguide is 3 times as large as the wavelength inside the waveguide (224.1 mm)). The six waveguide coupling slots 414 are radially formed in the dimensions of 50 mm×4 mm on the circle at a distance of 97.2 mm away from the center of the overlapping part (its radius is in the range of 70.5 mm to 123.8 mm) between the input side annular waveguide 411 and the output side annular waveguide 412. The output slot 415 is formed in the dimensions of 56 mm×4 mm on the circle where its central radius of 214 mm is the same as that of the output side annular waveguide 412. A 4E tuner, a directional coupler, an isolator, and a microwave power source (not shown) having a frequency of 2.45 GHz are connected in order to the H-distribution waveguide 413.

Figure 4A:
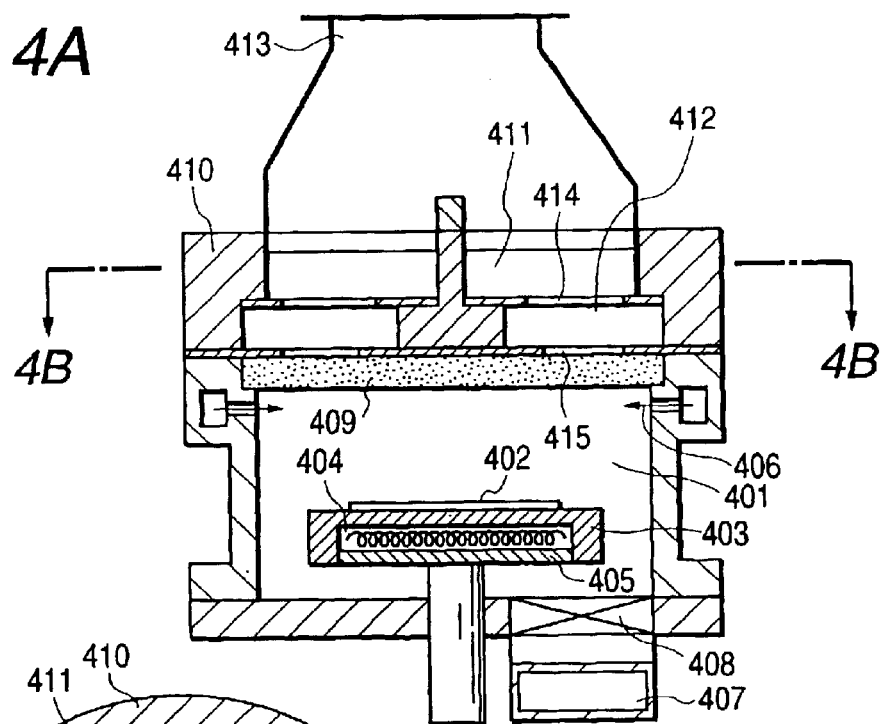
FIGS. 4A, 4B and 4C are respectively a cross sectional view and a schematic view showing a microwave plasma processing system employing a 3 λgDMA antenna for generating five standing waves by excitation using an AlN window according to still another embodiment of the present invention.
Figure 4B:
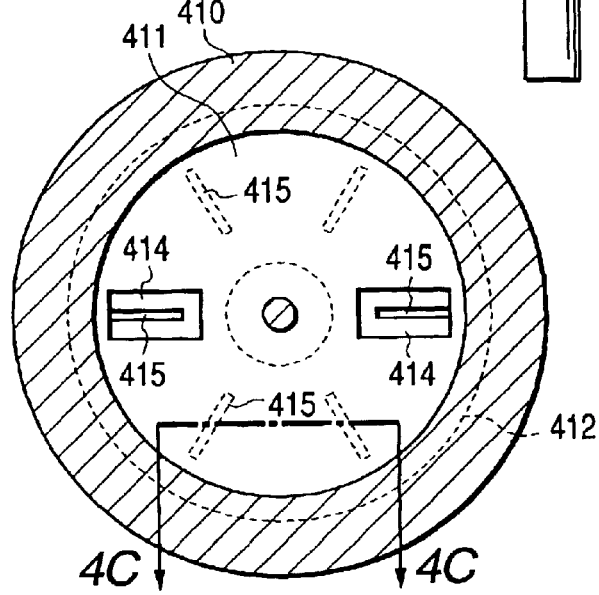
Figure 4C:
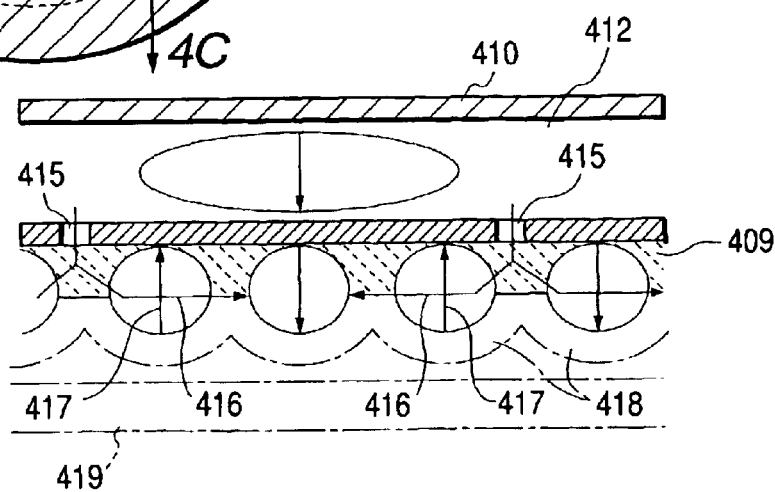

The plasma was generated under the conditions in which a flow rate of Ar is 500 sccm, a pressure is 13.3 Pa, and the microwave electric power is 3.0 kW using the microwave plasma processing system shown in FIGS. 4A to 4C and the resultant plasma was measured.

The measurement of the plasma was carried out on the basis of the single probe method in the following manner. The voltage applied to the probe was changed in the range of −10 V to +30 V, the current which is caused to flow through the probe was measured with an I-V measurement apparatus, and the electron density, the electron temperature and the plasma potential were respectively calculated from the resultant I-V characteristic curve on the basis of the method by Langmuir or the like.

It was, as a result of the measurement, confirmed that the electron density is $1.7\times10^{12}/cm^3\pm3.2\%$ (within $\Phi$300 plane) in the case of the pressure of 13.3 Pa and hence the uniform and stable plasma having the high electron density was formed.

EXAMPLES OF PLASMA PROCESSING

While the description will hereinbelow be given with respect to surface processing examples obtained using the above-mentioned plasma processing system, the processing examples are not limited thereto.

Processing Example 1

The ashing of a photo resist film was carried out using the microwave plasma processing system shown in FIGS. 3A to 3C. As a substrate 302, a silicon (Si) substrate ($\Phi$8 inches) was used which was obtained right after an interlayer $SiO_2$ film had been etched away and via holes were formed. First of all, after the Si substrate 302 was placed on a substrate supporting body 303 and the Si substrate 302 was heated up to a temperature of 250° C. through means 304 for adjusting a temperature, the air in a plasma processing chamber 301 was vacuum-exhausted through an exhaust system 307 and the pressure in the plasma processing chamber 301 was reduced down to $1.33\times10^{-5}$ Pa. Oxygen gas was introduced at a flow rate of 1.5 slm into the plasma processing chamber 301 through the plasma processing gas introduction ports 306.

Next, a conductance valve 308 provided between the plasma processing chamber 301 and the exhaust system 307 was adjusted to hold the pressure in the plasma processing chamber 301 at 133 Pa. The electric power of 1.5 kW was supplied from a microwave power source having a frequency of 2.45 GHz to the plasma processing chamber 301 through an annular non-terminal waveguide 310.

In such a manner, the plasma was generated in the plasma processing chamber 301. At this time, the oxygen gas which had been introduced into the plasma processing chamber 301 through the plasma processing gas introduction ports 306 became the oxygen radicals after excitation, decomposition and reaction to be transported in the direction of the Si substrate 302 to oxidize a photo resist film on the Si substrate 302 which was in turn vaporized to be removed therefrom. After the ashing was carried out, the evaluation was made with respect to the ashing speed, the charge density on the substrate surface, and the like.

The resultant ashing speed and uniformity were so excellent as being 5.6 $\mu$m/min±4.2% and the charge density on the substrate surface showed such a sufficiently low value as being $-1.3\times10^{11}/cm^2$.

Processing Example 2

The ashing of a photo resist film was carried out using the microwave plasma processing system shown in FIGS. 4A to 4C. As a substrate 402, a silicon (Si) substrate ($\Phi$8 inches) was used which was obtained right after a photo resist after high concentration implantation of $5E15$ $cm^{-2}$ is surface-hardened.

First of all, after the Si substrate 402 was placed on a substrate supporting body 403, the air in a plasma processing chamber 401 was vacuum-exhausted through an exhaust system (not shown) and the pressure in the plasma processing chamber 401 is reduced down to $1.33\times10^{-5}$ mbar. Oxygen gas and $CF_4$ was introduced at a flow rate of 1 slm and at a flow rate of 10 sccm, respectively, into the plasma processing chamber 401 through the plasma processing gas introduction ports 406.

Next, a conductance valve 408 provided between the plasma processing chamber 401 and the exhaust system 407 was adjusted to hold the pressure in the plasma processing chamber 401 at 0.6 Torr. The electric power of 1.5 kW was supplied from a microwave power source having a frequency of 2.45 GHz to the plasma processing chamber 401 through an annular non-terminal waveguide 403. In such a manner, the plasma was generated in the plasma processing chamber 401.

In this connection, the $CF_4$-added oxygen gas which had been introduced into the plasma processing chamber 401 through the plasma processing gas introduction ports 406 became the oxygen radicals including the fluorine radicals after excitation, decomposition and reaction to be transported to the Si substrate 402 to oxidize a photo resist film on the Si substrate 402 which was in turn vaporized to be removed therefrom. After carried out the ashing, the evaluation was made with respect to the ashing speed, the charge density on the substrate surface, and the like.

The resultant ashing speed and uniformity were so excellent as being 3.1 $\mu$m/min±4.4% and the charge density on the substrate surface showed such a sufficient low value as being $-1.7\times10^{11}/cm^2$.

Processing Example 3

A silicon nitride film for protection of a semiconductor element was formed using the microwave plasma processing system shown in FIGS. 3A to 3C. As the substrate 302, a P type monocrystalline silicon substrate (having plane orientation <100> and resistivity of 100 $\Omega$cm) with an interlayer $SiO_2$ film on which an Al wiring pattern (having line and space of 0.5 $\mu$m) was formed was used. First of all, after the silicon substrate 302 has been placed on the substrate supporting stage 303, the air in the plasma processing chamber 301 was vacuum-exhausted through the exhaust system 307 and the pressure in the plasma processing chamber 301 was reduced down to $1.33\times10^{-7}$ mbar.

Subsequently, the silicon substrate 302 was heated up to a temperature of 300° C. by causing a current to flow through a heater (not shown) to hold the substrate at this temperature. Nitrogen gas and monosilane gas were introduced at a flow rate of 600 sccm and at a flow rate of 200 sccm into the plasma processing chamber 301 through the plasma processing gas introduction ports 306, respectively.

Next, a conductance valve 308 provided between the plasma processing chamber 301 and the exhaust system 307 was adjusted to hold the pressure in the plasma processing chamber 301 at 266 Pa. Next, the electric power of 3.0 kW was supplied from a microwave power source (not shown) having a frequency of 2.45 GHz through an annular non-terminal waveguide 303.

In such a manner, the plasma was generated in the plasma processing chamber 301. At this time, the nitrogen gas which had been introduced into the plasma processing chamber 301 through the plasma processing gas introduction ports 306 was excited and decomposed in the plasma processing chamber 301 to become the hydrogen radicals to be transported to the silicon substrate 302 to react the monosilane gas so that a silicon nitride film with a thickness of 1.0 μm was formed on the silicon substrate 302. After formation of the film, the evaluation was made with respect to the film formation speed and the film quality such as the stress. The stress value was obtained by measuring the change in amount of warpage of the substrate before and after formation of the film with a laser interferometer Zygo (brand name).

It was, as a result of the measurement, confirmed that the film formation speed and uniformity of the resultant silicon nitride film were as large as 510 nm/min±3.2%, and also the resultant silicon nitride film was so excellent in film quality as being $1.1 \times 10^9$ dyne/cm$^2$ (compression) in stress, $1.3 \times 10^{-10}$ A/cm$^2$ in leakage current, and 9 MV/cm in breakdown voltage.

Processing Example 4

A silicon oxide film and a silicon nitride film for antireflection for a plastic lens were formed using the microwave plasma processing system as shown in FIGS. 4A to 4C.

As a substrate 402, a plastic convex lens with a diameter of 50 nm was used. After a lens 402 had been placed on a substrate supporting stage 402, the air in a plasma processing chamber 401 was vacuum-exhausted through an exhaust system 407 to reduce the pressure in the plasma processing chamber 401 down to $1.33 \times 10^{-5}$ Pa. The nitrogen gas and the monosilane gas were introduced at a flow rate of 240 sccm and at a flow rate of 100 sccm into the plasma processing chamber 401 through the plasma processing gas introduction ports 406, respectively. Next, a conductance valve 408 which was provided between the plasma processing chamber 401 and the exhaust system 407 was adjusted to hold the pressure in the plasma processing chamber 401 at $9.31 \times 10^{-1}$ Pa.

Next, the electric power of 3.0 kW was supplied from a microwave power source (not shown) having a frequency of 2.45 GHz to the plasma processing chamber 401 through an annular non-terminal waveguide 410. In such a manner, the plasma was generated in the plasma processing chamber 401. In this connection, the nitrogen gas which had been introduced through the plasma processing gas introduction ports 406 became the active species such as nitrogen gas after excitation and decomposition in the plasma processing chamber 401 to be transported to the lens 402 to react with the monosilane gas so that a silicon nitride film with 21 nm thickness was formed on the lens 402.

Next, the oxygen gas and the monosilane gas were introduced at a flow rate of 200 sccm and at a flow rate of 100 sccm into the plasma processing chamber 401 through the plasma processing gas introduction ports 406, respectively. Subsequently, a conductance valve 408 which was provided between the plasma processing chamber 401 and the exhaust system 407 was adjusted to hold the pressure in the plasma processing chamber 401 at 3 mTorr. Then, the electric power of 2.0 kW was supplied from a microwave power source (not shown) having a frequency of 2.45 GHz to the plasma processing chamber 401 through the annular non-terminal waveguide 410. In such a manner, the plasma was generated in the plasma processing chamber 401.

At this time, the oxygen gas introduced through the plasma processing gas introduction ports 406 was excited and decomposed to become the active species such as the oxygen atoms to be transported to the glass substrate 402 to react the monosilane gas so that a silicon oxide film with a thickness of 86 nm was formed on the glass substrate 402. After formation of the film, the film formation speed and the reflection characteristics were evaluated.

It was, as a result of the measurement, confirmed that the film formation speed and uniformity of the resultant silicon nitride film and silicon oxide film were so excellent as being 310 nm/min±2.3% and 330 nm/min±2.5%, respectively, and also film quality thereof showed an excellent optical characteristics as being 0.2% in reflectance in the vicinity of 500 nm.

Processing Example 5

A silicon oxide film for interlayer insulation for a semiconductor element was formed using the microwave plasma processing system shown in FIGS. 2A to 2C.

As the substrate 202, a P type monocrystalline silicon substrate (having plane orientation <100> and resistivity of 10 Ωcm) was used in which an Al pattern (having line and space of 0.5 μm) was formed on the most upper portion thereof. First of all, the silicon substrate 202 was placed on the substrate supporting body 203. Then, the air in the plasma processing chamber 201 was vacuum-exhausted through the exhaust system 207 to reduce the pressure in the plasma processing chamber 201 down to $1.33 \times 10^{-5}$ Pa. Subsequently, the silicon substrate 202 was heated by causing a current to flow through the means 204 for adjusting a substrate temperature up to a temperature of 300° C. to hold the substrate at this temperature.

The oxygen gas and the monosilane gas were introduced at a flow rate of 500 sccm and at a flow rate of 200 sccm into the plasma processing chamber 201 through the plasma processing gas introduction ports 206, respectively. Subsequently, a conductance valve 208 which was provided between the plasma processing chamber 201 and the exhaust system 207 was adjusted to hold the pressure in the plasma processing chamber 201 at $39.9 \times 10^{-1}$ Pa.

Next, the electric power of about 300 W having a frequency of about 13.56 MHz was supplied to the substrate supporting body 202 through the means for applying a high-frequency bias 205, and also the electric power of about 2.0 kW having a frequency of 2.45 GHz was supplied from a microwave power source (not shown) to the plasma processing chamber 201 through the annular non-terminal waveguide 210.

In such a manner, the plasma was generated in the plasma processing chamber 201. The oxygen gas which had been introduced through the plasma processing gas introduction ports 206 became the active species after excitation and decomposition in the plasma processing chamber 201 to be transported to the silicon substrate 202 to react with the monosilane gas so that a silicon oxide film with a thickness of 0.8 μm was formed on the silicon substrate 202. At this time, the ion species are accelerated by RF bias to enter the substrate 202 to thereby improve cutting levelness of the film on the pattern.

After completion of the processing, the film formation speed, the uniformity, the breakdown voltage and the stepped portion covering property were evaluated. The stepped portion covering property was evaluated by observing a cross section of the silicon oxide film formed on the Al wiring pattern with a scanning electron microscope (SEM) to observe the voids.

It was confirmed that the film formation speed and the uniformity of the resultant silicon oxide film were so excellent as being 250 nm/min±2.8%, and also the film quality was so excellent that the silicon oxide film had the breakdown voltage of 8.7 MV/cm and is free from any of the voids.

Processing Example 6

An SiO$_2$ film as an interlayer film for a semiconductor element was etched away using the microwave plasma processing system shown in FIGS. 4A to 4C.

As to the substrate 402, a P type monocrystalline silicon substrate (having plane orientation <100> and resistivity of 10 Ωcm) was used in which an interlayer SiO$_2$ film with a thickness of 1 μm was formed on an Al pattern (having line and space of 0.18 μm). First of all, after the silicon substrate 402 had been placed on the substrate supporting stage 403, the air in the plasma processing chamber 401 was vacuum-exhausted to reduce the pressure in the plasma processing chamber 401 down to 1.33×10$^{-5}$ Pa. Then, C$_4$F$_8$ was introduced at a flow rate of 100 sccm into the plasma processing chamber 401 through the plasma processing gas introduction ports 406.

Subsequently, a conductance valve 408 which was provided between the plasma processing chamber 401 and the exhaust system 407 was adjusted to hold the pressure in the plasma processing chamber 401 at 1.33 Pa. Next, the electric power of 300 W was supplied to the substrate supporting body 402 through the high frequency applying means for applying a frequency of 13.56 MHz, and also the electric power of 2.0 kW was supplied from a microwave power source having a frequency of 2.45 GHz to the plasma processing chamber 401 through the annular non-terminal waveguide 410. In such a manner, the plasma was generated in the plasma processing chamber 401.

The C$_4$F$_8$ gas which had been introduced into the plasma processing chamber 401 through the plasma processing gas introduction ports 406 were excited and decomposed to become the active species in the plasma processing chamber 401 to be transported to the silicon substrate 402 so that the interlayer SiO2 film was etched away with the ions accelerated by the self-bias. The substrate temperature rose only up to 80° C. due to the operation of the cooler 404. After completion of the etching, the etching speed, the selection ratio and the etching shape were evaluated. The etching shape was observed and evaluated by observing a cross section of the etched silicon oxide film with a scanning electron microscope (SEM).

It was confirmed that the etching speed, the uniformity and the selection ratio of the interlayer SiO2 film to a photo resist (PR) film were so excellent as being 440 nm/min±4.2%, the etching shape is roughly vertical and the degree of the micro-loading effect is also low.

Processing Example 7

A poly allyle ether (PAE) film for interlayer insulation for a semiconductor element was etched away using the microwave plasma processing system shown in FIGS. 2A to 2C.

As to the substrate 202, a P type monocrystalline silicon substrate (having plane orientation <100> and resistivity of 10 Ωcm) was used in which a pattern made of an SiO$_2$ film with a thickness of 0.13 μm thickness was formed as the hard mask on the PAE film with a thickness of 0.5 μm by a thickness of 0.1 μm.

First of all, after the silicon substrate 202 had been placed on the substrate supporting stage 203 and the substrate temperature had been cooled down to 0° C. through the cooler 204, the air in the plasma processing chamber 201 was vacuum-exhausted through the exhaust system 207 to reduce the pressure in the plasma processing chamber 201 down to 1.33×10$^{-5}$ Pa. Then, NH$_3$ was introduced at a flow rate of 200 sccm into the plasma processing chamber 201 through the plasma processing gas introduction ports 206.

Subsequently, a conductance valve 208 which was provided between the plasma processing chamber 201 and the exhaust system 207 was adjusted to hold the pressure in the plasma processing chamber 201 at 13.3 Pa. Next, the electric power of about 300 W having a frequency of about 2 MHz was supplied to the substrate supporting body 202 through the high frequency applying means, and also the electric power of about 2.0 kW having a frequency of 2.45 GHz was supplied to the plasma processing chamber 201 through the annular non-terminal waveguide 210. In such a manner, the plasma was generated in the plasma processing chamber 201.

The NH$_3$ gas which had been introduced through the plasma processing gas introduction ports 206 were excited and decomposed to become the active species in the plasma processing chamber 201 to be transported to the silicon substrate 202 so that the PAE film was etched away with the ions accelerated by the self-bias. After completion of the etching, the etching speed, the selection ratio and the etching shape were evaluated. The etching shape was observed and evaluated by observing a cross section of the etched silicon oxide film with a scanning electron microscope (SEM).

It was confirmed that the etching speed, the uniformity and the selection ratio to the SiO2 are so excellent as being 460 nm/min±3.7% and 10, the etching shape is roughly vertical and the degree of the micro-loading effect is also low.

As described above, an element of the present invention is obtained by subjecting a semiconductor substrate on which elements are to be formed to the various surface processings such as etching, doping, CVD, oxidation, nitriding, and ashing to manufacture a large number of elements thereon to cut the wafer into chips. The plasma processing system according to the present invention is utilized in at least one processing among these various kinds of surface processings.

As set forth hereinabove, according to the present invention, in a plasma processing system in which a microwave is introduced into a plasma processing chamber through an annular waveguide having a plurality of slots provided on the plasma processing chamber side to generate plasma within the plasma processing chamber, the annular waveguide includes an input side waveguide and an output side waveguide, and the slots are bored to be provided between the waveguides two by two at predetermined intervals in a circumferential direction, whereby it becomes possible to introduce the microwave which is uniform in the circumferential direction into the plasma processing chamber and hence it becomes possible to generate the uniform plasma of high quality in the plasma processing chamber. It becomes, as a result, possible to carry out the high quality plasma processing at high speed.

While the present invention has been particularly shown and described with reference to the preferred embodiments, it will be understood that the various changes and modifications will occur to those skilled in the art without departing from the scope and true spirit of the invention. The scope of the invention is, therefore, to be determined solely by the appended claims.

What is claimed is:

1. A plasma processing system in which gas is introduced into a plasma processing chamber, and a microwave is supplied to said plasma processing chamber through an annular waveguide having a plurality of slots provided at predetermined intervals in a circumferential direction on the same plane facing a surface of an object to be processed on the plasma processing chamber side to generate the plasma within said plasma processing chamber, wherein said annular waveguide is a two-layer structure of an input side waveguide and an output side waveguide whose central diameters are different from each other, and said slots are provided between said waveguides at predetermined intervals in a circumferential direction.

2. A plasma processing system according to claim 1, wherein the microwave is introduced through introduction ports which are provided at predetermined intervals in a circumferential direction with a center of said annular waveguide as an axis into said input side waveguide.

3. A plasma processing system according to claim 2, wherein the distributed microwaves are introduced through said introduction ports, and the microwave is distributed by an H distributor when one circumferential length of said input side waveguide is odd number multiples of the wavelength inside the waveguide of the microwave, while the microwave is distributed by an E distributor when one circumferential length of said input side waveguide is even number multiples of the waveguide inside the waveguide of the microwave, and each of the predetermined intervals at which said introduction ports are provided is 180 degrees.

4. A plasma processing system according to any one of claims 1 to 3, wherein the microwave to be introduced into said input side waveguide is introduced through a rectangular waveguide, and an inner cross section of said input side waveguide is the same dimensions as those of said rectangular waveguide.

5. A plasma processing system according to claim 1, wherein said slots provided between said waveguides two by two are provided radially and when the central radii of said waveguides are respectively $r_{g2}$ and $r_{g1}$, the central radius $r_{s2}$ of each of said slots is expressed by the following approximate expression:

$$r_{s2} \cong (r_{g2}+r_{g1})/2.$$

6. A plasma processing system according to claim 1, wherein the central radius $r_{g1}$ of said output side waveguide is substantially equal to the central radius $r_{s1}$ of each of said slots provided on the side of said plasma processing chamber, and when the number of loops of a surface standing wave excited between the adjacent slots two by two is $n_l$, the wavelength of the surface wave is $\lambda_s$, and the magnification of one circumferential length of said output side waveguide to the wavelength inside the waveguide of the microwave in said output side waveguide is ng, the central radius rgg1 is expressed by the following approximate expression:

$$r_{g1} \cong n_l \lambda_s/2 \, \tan[(\pi/2n_g)][1+\cos(\pi/n_g)].$$

7. A plasma processing system according to claim 1, wherein when the wavelength inside the waveguide in said output side waveguide is $\lambda$g1, the length $l_{s1}$ of each of said slots between said waveguides is expressed by the following approximate expression:

$$1_{sl} \cong \lambda_{g1}/4.$$

8. A plasma processing system according to claim 1, wherein a dielectric window is provided between said annular waveguide and said plasma processing chamber, and the main constituent of said dielectric window is aluminum nitride.

9. A plasma processing system according to claim 1, further comprising high-frequency bias applying means for applying a high frequency bias to substrate supporting means for supporting said object to be processed within said plasma processing chamber.

10. A surface processing method comprising:
  (a) introducing a gas into a plasma processing chamber;
  (b) supplying microwaves to said plasma processing chamber through an annular waveguide having a plurality of slots at predetermined intervals in a circumferential direction on the same plane, said annular waveguide having a two-layer structure of (i) an input side waveguide for receiving said microwaves and (ii) an output side waveguide for directing said microwaves toward a surface of an object in the plasma processing chamber said to generate a plasma within the plasma processing chamber;
wherein said input side waveguide and said output side waveguide have different central diameters, and wherein said slots being provided between said input side waveguide and said output side waveguide; and
  (c) conducting surface processing of said object employing said plasma.

11. The surface processing method of claim 10, wherein said surface processing is conducted by etching, ashing, chemical vapor depositing, doping, oxidizing or nitriding.

* * * * *

UNITED STATES PATENT AND TRADEMARK OFFICE
CERTIFICATE OF CORRECTION

PATENT NO. : 6,884,318 B2
DATED : April 26, 2005
INVENTOR(S) : Nobumasa Suzuki

It is certified that error appears in the above-identified patent and that said Letters Patent is hereby corrected as shown below:

Title page,
Item [56], References Cited, FOREIGN PATENT DOCUMENTS, "2001250778 A" should read -- 2001-250778 A --.

Column 3,
Line 53, "chamber," close right margin; and
Line 54, "characterized" close left margin.

Column 4,
Line 18, "rs2" should read -- $r_{s2}$ --.

Column 7,
Line 53, "(e.g." should read -- e.g., --.

Column 8,
Line 35, "rsl" should read -- $r_{s1}$ --;
Line 38, "nl," should read -- $n_1$, --;
Line 39, "λs" should read -- $\lambda_s$ --;
Line 42, "ng," should read -- $n_g$, --;
Line 45, "λ$_s$/2s tan" should read -- $\lambda_s$/2 tan --;
Line 47, "ls1" should read -- $1_{s1}$ --; and
Line 61, "SiO2-based" should read -- $SiO_2$-based --.

Column 9,
Line 56, "SiC." should read -- SiC --.

Column 10,
Line 21, "(TMAI)," should read -- (TMAl),-- and "(TEAI)," should read -- (TEAl), --;
Line 22, "(TIBAI)," should read -- (TIBAl), --;
Line 23, "(DMAIH)," should read -- (DMA1H), --;
Line 35, "(TMAI)," should read -- (TMAl), --;
Line 36, "(TEAI)," should read -- (TEAl), -- and "(TIBAI)," should read -- (TIBAl), --; and
Line 37, "(DMAIH)," should read -- (DMAlH), --.

UNITED STATES PATENT AND TRADEMARK OFFICE
CERTIFICATE OF CORRECTION

PATENT NO. : 6,884,318 B2
DATED : April 26, 2005
INVENTOR(S) : Nobumasa Suzuki

It is certified that error appears in the above-identified patent and that said Letters Patent is hereby corrected as shown below:

Column 11,
Line 25, "ng" should read -- $n_g$ --; and
Line 27, "n1" should read -- $n_1$ --.

Column 12,
Line 8, "a" should read -- an --.

Column 14,
Line 1, "n1" should read -- $n_1$ --.

Column 20,
Line 24, "carried" should read -- carrying --.

Column 21,
Line 12, "1.3x10" should read -- $1.3 \times 10^{-10}$ --; and
Line 13, "$^{10}$" should be deleted.

Column 22,
Line 5, "an" should be deleted.

Column 23,
Line 30, "SiO2" should read -- $SiO_2$ --; and
Line 39, "SiO2" should read -- $SiO_2$ --.

Column 24,
Line 20, "SiO2" should read -- $SiO_2$ --.

Column 25,
Line 34, "$r_{s2} \equiv (r_{g2}$" should read -- $r_{s2} \cong ,(r_{g2}$ --.

UNITED STATES PATENT AND TRADEMARK OFFICE
CERTIFICATE OF CORRECTION

PATENT NO.     : 6,884,318 B2
DATED          : April 26, 2005
INVENTOR(S)    : Nobumasa Suzuki It is certified that error appears in the above-identified patent and that said Letters Patent is hereby corrected as shown below:

Column 26,
Line 1, "rgg1" should read -- $r_{g1}$ --; and
Line 11, "$l_{s1}$" should read -- $l_{sl}$ --.

Signed and Sealed this

Twenty-seventh Day of September, 2005

JON W. DUDAS
*Director of the United States Patent and Trademark Office*